United States Patent
Park

(10) Patent No.: US 7,954,073 B2
(45) Date of Patent: May 31, 2011

(54) METHODS OF ARRANGING MASK PATTERNS RESPONSIVE TO ASSIST FEATURE CONTRIBUTION TO IMAGE INTENSITY AND ASSOCIATED APPARATUS

(75) Inventor: Dong-woon Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 429 days.

(21) Appl. No.: 12/164,645

(22) Filed: Jun. 30, 2008

(65) Prior Publication Data

US 2009/0013302 A1    Jan. 8, 2009

(30) Foreign Application Priority Data

Jul. 6, 2007 (KR) .......................... 10-2007-0068167

(51) Int. Cl.
*G06F 17/50* (2006.01)
(52) U.S. Cl. ................ 716/55; 716/50; 716/51; 716/52; 716/53; 716/54; 430/5; 430/30
(58) Field of Classification Search ............... 430/5, 30; 716/50–55
See application file for complete search history.

(56) References Cited

U.S. PATENT DOCUMENTS

| | | | |
|---|---|---|---|
| 7,487,489 B2 * | 2/2009 | Granik | 716/19 |
| 7,620,930 B2 * | 11/2009 | Van Den Broeke et al. | 716/19 |
| 7,721,246 B2 * | 5/2010 | Li et al. | 716/19 |
| 7,877,723 B2 * | 1/2011 | Park | 716/50 |
| 2006/0075377 A1 | 4/2006 | Broeke et al. | |
| 2006/0188673 A1 | 8/2006 | Melvin, III et al. | |
| 2006/0250589 A1 | 11/2006 | Eurlings et al. | |
| 2008/0138719 A1 * | 6/2008 | Park | 430/5 |
| 2008/0138720 A1 * | 6/2008 | Park | 430/5 |

* cited by examiner

*Primary Examiner* — Nghia M Doan
(74) *Attorney, Agent, or Firm* — Myers Bigel Sibley & Sajovec, PA

(57) ABSTRACT

Methods and apparatus are disclosed that arrange mask patterns in response to the contribution of an assist feature to image intensity. In some methods of arranging mask patterns, a distribution of functions $h(\xi-x)$ is obtained which represents the contribution of an assist feature to image intensity on a main feature. Neighboring regions of the main feature are discretized into finite regions, and the distribution of the functions $h(\xi-x)$ is replaced with representative values $\bar{h}(x,\xi)$ of the discretized regions. A position of the assist feature is determined using polygonal regions having the same $\bar{h}(x,\xi)$. As described, the term x is the position of the main feature and the term $\xi$ is the position of the assist.

13 Claims, 10 Drawing Sheets

| 0 | 0 | 0 | 0 | 0 | 0 | 0 |
|---|---|---|---|---|---|---|
| 0 | 1 | 0 | 0 | 0 | 1 | 0 |
| -2 | 0 | 0 | 0 | 0 | 0 | -2 |
| 0 | 3 | 0 | M | 0 | 3 | 0 |
| -2 | 0 | 0 | 0 | 0 | 0 | -2 |
| 0 | 1 | 0 | 0 | 0 | 1 | 0 |
| 0 | 0 | 0 | 0 | 0 | 0 | 0 |

METHODS OF ARRANGING MASK PATTERNS RESPONSIVE TO ASSIST FEATURE CONTRIBUTION TO IMAGE INTENSITY AND ASSOCIATED APPARATUS

CROSS-REFERENCE TO RELATED PATENT APPLICATION

This application claims the benefit of Korean Patent Application No. 10-2007-0068167, filed on Jul. 6, 2007, in the Korean Intellectual Property Office, the disclosure of which is incorporated herein in its entirety by reference.

BACKGROUND OF THE INVENTION

1. Field of the Invention

The present invention relates to fabricating of semiconductor features, and more particularly, to methods and apparatus for arranging mask patterns.

2. Description of the Related Art

One of the typical goals in integrated circuit fabrication is to faithfully reproduce an original circuit design on a semiconductor wafer using a mask while using as much area of the semiconductor wafer as possible. Another typical goal is to optimize exposure and improve image intensity on the semiconductor wafer. Yet another typical goal is to increase the depth of focus (DOF) and exposure latitude (EL). However, the microscopic size of mask features can make it difficult for light to pass through holes or lines in the mask. Consequently, the DOF and the EL that may be obtain using a mask can be reduced.

One conventional approach that attempts to overcome these difficulties includes using assist features that are arranged on a mask so that light intensity on a feature that is to be generated can be increased (which, in turn, can increase DOF and/or EL). Currently, such assist features are manually arranged by a semiconductor design engineer through a process of trial and error which is limited by the engineer's ability and skill, such that a large amount of time can be required and the assist features may not be arranged on a broad area of the mask relative to the overall pattern of the mask. Furthermore, if the mask has various different patterns thereon, it may be very difficult to generate the assist features in a stable manner. Therefore, a new approach is needed to allow rapid determination of the desired/optimal position of the assist features.

SUMMARY OF THE INVENTION

Various embodiments of the present invention provide methods and computer program products that determine a position of an assist feature on a mask. Some of the methods and computer program products may increase the speed with which the position of the assist feature can be determined.

According to some embodiments of the present invention, a method of arranging mask patterns includes: obtaining a distribution of functions $h(\xi-x)$ representing the contribution of an assist feature to image intensity on a main feature; discretizing neighboring regions of the main feature into finite regions, and replacing the distribution of the functions $h(\xi-x)$ with representative values $\bar{h}(x,\xi)$ of the discretized regions; and determining a position of the assist feature by using polygonal regions having the same $\bar{h}(x,\xi)$, where $x$ is the position of the main feature and $\xi$ is the position of the assist feature. The discretizing of the neighboring regions of the main feature into the finite regions may comprise discretizing the neighboring regions into finite square shaped regions. The neighboring regions of the main feature may have a width W of 1000 to 2000 pixels.

The obtaining of the distribution of the functions $h(\xi-x)$ may comprise obtaining the functions $h(\xi-x)$ that satisfy $$\frac{I(x) - I_0(x)}{2\sqrt{I_0(x)}} = h(\xi - x)m(\xi)\Delta\xi,$$

where $I(x)$ is an image intensity on the main feature when the assist feature is present, $I_0(x)$ is an image intensity on the main feature when the assist feature is not present, and $m(\xi)$ is a mask transmittance.

The discretizing may comprise: discretizing the distribution of the functions $h(\xi-x)$ into finite regions, replacing the distribution of the functions $h(\xi-x)$ with a distribution of $\hat{h}(x,\xi)$ consisting of $\hat{h}_0, \hat{h}_1, \hat{h}_2, \ldots, \hat{h}_n$; and replacing the distribution of $\hat{h}(x,\xi)$ with the distribution of $\bar{h}(x\xi)$ consisting of $\bar{h}_0, \bar{h}_1, \bar{h}_2, \ldots, \bar{h}_N$ and that satisfies $$\{\bar{h}_I : 0 \leq I \leq N\} = \{\hat{h}_I : 0 \leq I \leq N\} \text{ when } I \geq J, |\bar{h}_I| \geq |\bar{h}_J|.$$

The determination of the position of the assist feature may comprise: determining, by using the distribution of $\bar{h}(x,\xi)$, a region $\omega_I(I=0, 1, \ldots, N)$ satisfying $\omega_I = \{\xi : \bar{h}(\xi-x) = \bar{h}_I \text{ for some } x \in M\}$; determining, by using the region $\omega_I(I=0, 1, \ldots, N)$, a region $\gamma N$ that satisfies $$\gamma_I = \gamma_{I-1} - \omega_I \text{ when } \bar{h}_I \leq 0$$
$$= \gamma_{I-1} - U\omega_I \text{ when } \bar{h}_I > 0$$
$$\gamma_0 = \omega_0;$$

and determining the region $\gamma N$ as the position of the assist feature.

The determination of the position of the assist feature may comprise: determining, with the use of $\bar{h}(x,\xi)$, a region $\omega_I$ $(I=0, 1, \ldots, N)$ that satisfies $\omega_I = \{\xi : \bar{h}(\xi-x) = \bar{h}_I \text{ for some } x \in M\}$; obtaining a region $\gamma N$ by excluding a region $\omega_J$ where $\bar{h}_J$ is less than 0 from a region including all the region $\omega_I$ $(I=0, 1, \ldots, N)$; and determining the region $\gamma N$ as the position of the assist feature.

The size of the assist feature can be reduced in response to when a side-lobe phenomenon where the assist feature is printed on a semiconductor wafer is detected after the determining of the position of the assist feature.

An optical proximity correction process can be applied to the main feature to obtain a critical dimension after the determining of the position of the assist feature.

A mask rule check process can be applied to improve mask performance after the determining of the position of the assist feature.

The discretizing of the neighboring regions of the main feature into the finite regions can comprise discretizing the neighboring regions into finite square shaped regions.

In some other embodiments, a computer program product is configured to arrange mask patterns, the computer program product comprises a computer-readable storage medium having computer-readable program code embodied in the medium. The computer-readable program code comprises: computer-readable program code that is configured to obtain a distribution of functions $h(\xi-x)$ representing the contribution of an assist feature to image intensity on a main feature; computer-readable program code that is configured to discretize neighboring regions of the main feature into finite regions, and to replace the distribution of the functions h(ξ–x) with representative values $\bar{h}(x,\xi)$ of the discretized regions; and computer-readable program code that s configured to determine a position of the assist feature by using polygonal regions having the same $\bar{h}(x,\xi)$, where x is the position of the main feature and ξ is the position of the assist feature.

The computer-readable program code obtaining of the distribution of the functions h(ξ–x) can comprise computer-readable program code that obtains the functions h(ξ–x) that satisfy $$\frac{I(x) - I_0(x)}{2\sqrt{I_0(x)}} = h(\xi - x)m(\xi)\Delta\xi,$$

where I(x) is an image intensity on the main feature when the assist feature is present, $I_0(x)$ is an image intensity on the main feature when the assist feature is not present, and m(ξ) is a mask transmittance.

The computer-readable program code that carries out the discretizing can comprise computer-readable program code that: discretizes the distribution of the functions h(ξ–x) into finite regions, replaces the distribution of the functions h(ξ–x) with a distribution of $\hat{h}(x,\xi)$ consisting of $\hat{h}_0, \hat{h}_1, \hat{h}_2, \ldots, \hat{h}_N$; and replaces the distribution of $\hat{h}(x,\xi)$ with the distribution of $\bar{h}(x,\xi)$ consisting of $\bar{h}_0, \bar{h}_1, \bar{h}_2, \ldots, \bar{h}_N$ and that satisfy {$\bar{h}_I$:0≤I≤N}={$\hat{h}_I$:0≤I≤N} when I≥J, |$\bar{h}_I$|≥|$\bar{h}_J$|

The computer-readable program code that carries out the determining of the position of the assist feature can comprise computer-readable program code that: determines, by using the distribution of $\bar{h}(x,\xi)$, a region $\omega_I$ (I=0, 1, . . . , N) satisfying $\omega_I$={ξ:$\bar{h}$(ξ–x)=$\bar{h}_I$ for some x∈M};

determines, by using the region $\omega_I$ (I=0, 1, . . . , N), a region γN satisfying $$\gamma_I = \gamma_{I-1} - \omega_I \text{ when } \bar{h}_I \leq 0$$
$$= \gamma_{I-1} - \bigcup \omega_I \text{ when } \bar{h}_I > 0$$
$$\gamma_0 = \omega_0; \text{ and}$$

determines the region γN as the position of the assist feature.

The computer-readable program code that determines the position of the assist feature can comprise computer-readable program code that:

determines, with the use of $\bar{h}(x,\xi)$, a region $\omega_I$ (I=0, 1, . . . , N) that satisfies $\omega_I$={ξ:$\bar{h}$(ξ–x)=$\bar{h}_I$ for some x∈M};

obtains a region γN by excluding a region $\omega_J$ where $\bar{h}_J$ is less than 0 from a region including all the region $\omega_I$ (I=0, 1, . . . , N); and determines the region γN as the position of the assist feature.

BRIEF DESCRIPTION OF THE DRAWINGS

The above and other features and advantages of the present invention will become more apparent by describing in detail exemplary embodiments thereof with reference to the attached drawings in which:

FIGS. 9 through 12 illustrates regions where $\bar{h}_0, \bar{h}_1, \bar{h}_2, \bar{h}_3$ are respectively 0, 1, –2, and 3 among the neighboring regions of the main feature having the predetermined size of FIG. 7 according to some embodiments of the present invention.

DETAILED DESCRIPTION OF THE INVENTION

Figure 1:
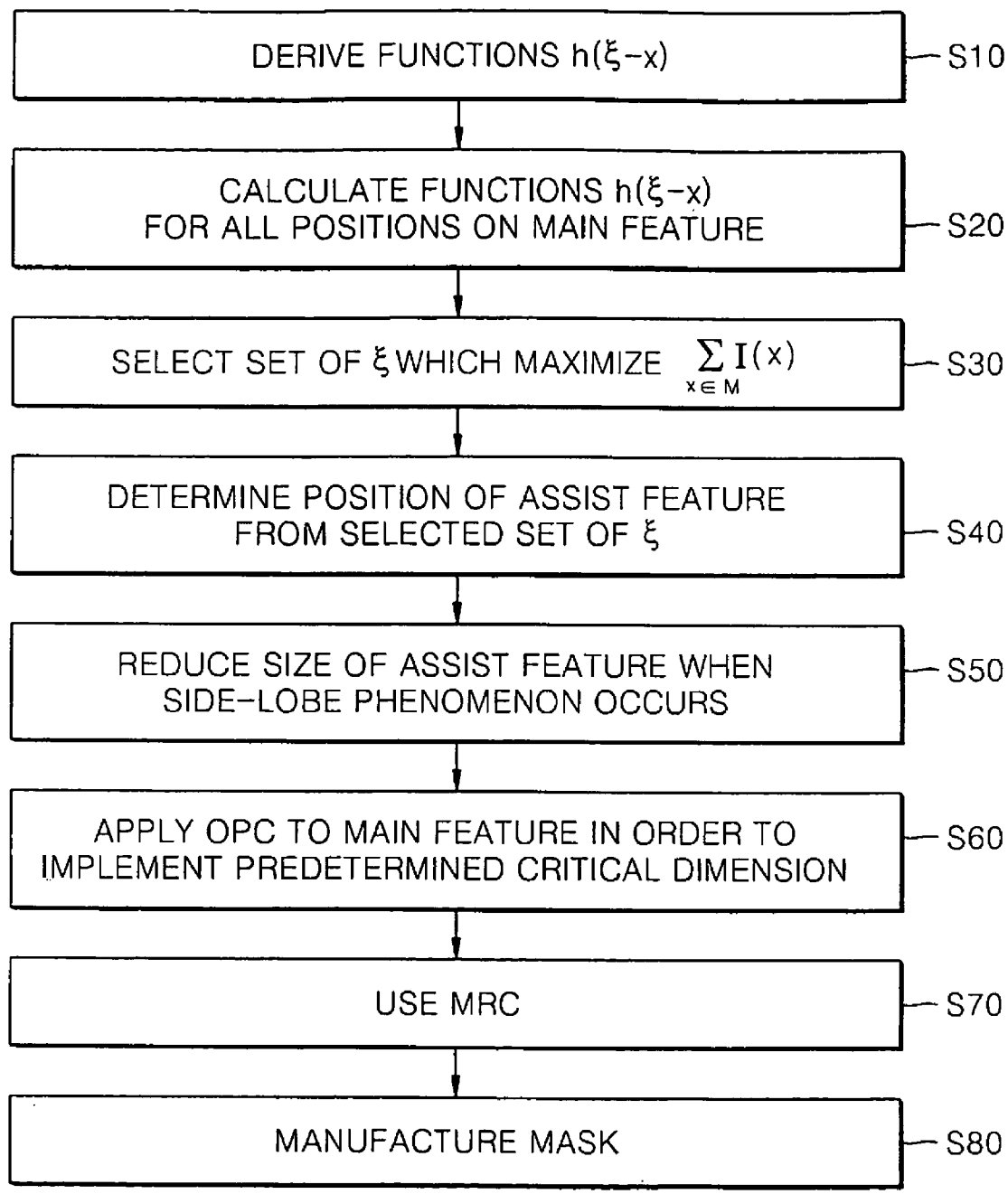
FIG. 1 through 4 are flowcharts illustrating apparatus/methods of arranging mask patterns according to some embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like reference numerals refer to like elements throughout. As used herein, the term "and/or" includes any and all combinations of one or more of the associated listed items.

Spatially relative terms, such as "bottom," "beneath," "below," "lower," "top," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the specification and relevant art and will not be interpreted in an idealized or overly formal sense unless expressly so defined herein.

Methods/apparatus for determining positions of assist features on a mask and arranging mask patterns will now be described in accordance with various embodiments of the present invention. Each of the assist features can correspond to a mask feature that is smaller than a minimum feature size that can be resolved on a device on which the mask is projected, and which may be used to reduce (via destructive interference with) an undesirable diffraction pattern created by the main mask pattern.

Image intensity I(x) generated on a semiconductor wafer by a main feature on a mask may be approximated by $$I(x) \cong e^2(x) = \left(e_0(x) + \sum_\xi \Delta e(x, \xi)\right)^2 \quad (1)$$

where x indicates the position of a main feature, ξ indicates the position of an assist feature, $e_0(x)$ indicates the contribution of the main feature to image intensity I(x), and $$\sum_\xi \Delta e(x, \xi)$$

indicates the contribution of the assist feature to the image intensity I(x). An increase or decrease in the contributions of the main feature and the assist feature leads to an increase or decrease in the image intensity I(x). Assuming that m(ξ) is transmittance of the mask, the contribution of the assist feature may be given by $$\Delta e(x, \xi) = h(\xi - x) m(\xi) \Delta \xi \quad (2)$$

Also, assuming that $I_0(x)$ is the image intensity at the main feature when the assist feature does not exist, Equation 1 may be represented by Equations 3 through 5.

$$I_0 = e_0^2 \quad (3)$$

$$I = I_0 + \Delta I \quad (4)$$

$$\Delta I \cong 2e\Delta e \quad (5)$$

Equation 6 may also be obtained from Equations 3 through 5.

$$\Delta e = \frac{I - I_0}{2e} \cong \frac{I - I_0}{2e_0} = \frac{I - I_0}{2\sqrt{I_0}} \quad (6)$$

That is, the contribution of the assist feature can be represented by its relationship with the image intensity. The relationship between a function h, which represents the contribution of the assist feature, and the image intensity is defined by $$\frac{I(x) - I_0(x)}{2\sqrt{I_0(x)}} = h(\xi - x) m(\xi) \Delta \xi. \quad (7)$$

Figure 5:
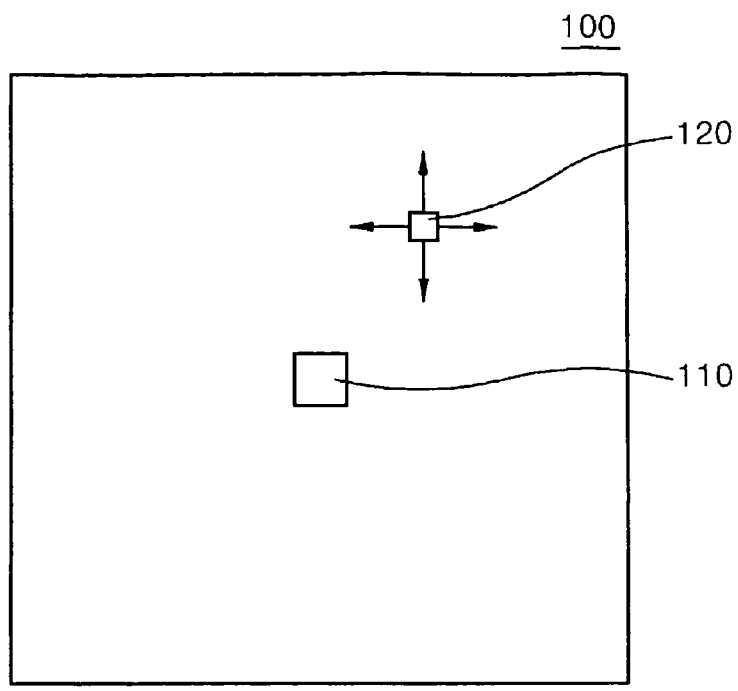
FIG. 5 is a plan view of a mask including a main feature and an assist feature which are referenced to describe methods of deriving a function h according to some embodiments of the present invention.

FIG. 5 is a plan view of a mask 100 including a main feature 110 and an assist feature 120 that is referenced to describe a method of deriving a function h according to some embodiments of the present invention. Referring to FIG. 5, a function h(ξ−x) may be represented by image intensity at the main feature 110 and mask transmittance of the assist feature 120 according to Equation 7. The function h(ξ−x) is calculated by fixing the main feature 110 formed of a small, isolated portion onto the mask 100 and sweeping the small-sized assist feature 120 over the entire domain of the mask 100 as indicated by arrows in FIG. 5. A goal here is to calculate a function h as ξ−x, i.e., the relative displacement between the main feature 110 and the assist feature 120.

According to Equation 2, the function h is dependent on ξ−x, i.e., the relative position between the main feature 110 and the assist feature 120, but is not directly dependent on the position of the main feature 110. Therefore, once the function h is calculated as described above and is stored in the form of a table, even when a plurality of main features exist, values of functions h(ξ−x) may then be more easily and quickly obtained using a look-up table method by applying the relative position ξ−x between an assist feature to be reviewed and each of the main features to the table of the functions h calculated in advance.

FIGS. 1 through 4 are flowcharts illustrating methods/apparatus for arranging mask patterns according to some embodiments of the present invention. In operation S10, functions h(ξ−x) are derived as described above. Referring to FIG. 1, in operation S30, a set of ξ which maximize $$\sum_{x \in M} I(x)$$

is selected. In operation S40, the position of an assist feature from the selected set of ξ is determined. Here, M indicates the entire domain of a mask. That is, the assist feature is placed so as to enhance the image intensity of the entire mask. Referring to Equation 1, assuming that the condition that $$\sum_{x \in M} I(x)$$

is maximized means the condition that $$\sum_{x \in M} e(x, \xi)$$

is maximized, thus Equation 8 has to be maximized.

$$\sum_{x \in M} \sum_\xi e(x, \xi) = \sum_{x \in M} \sum_\xi = h(\xi - x) m(\xi) \Delta \xi \quad (8)$$

Figure 2:
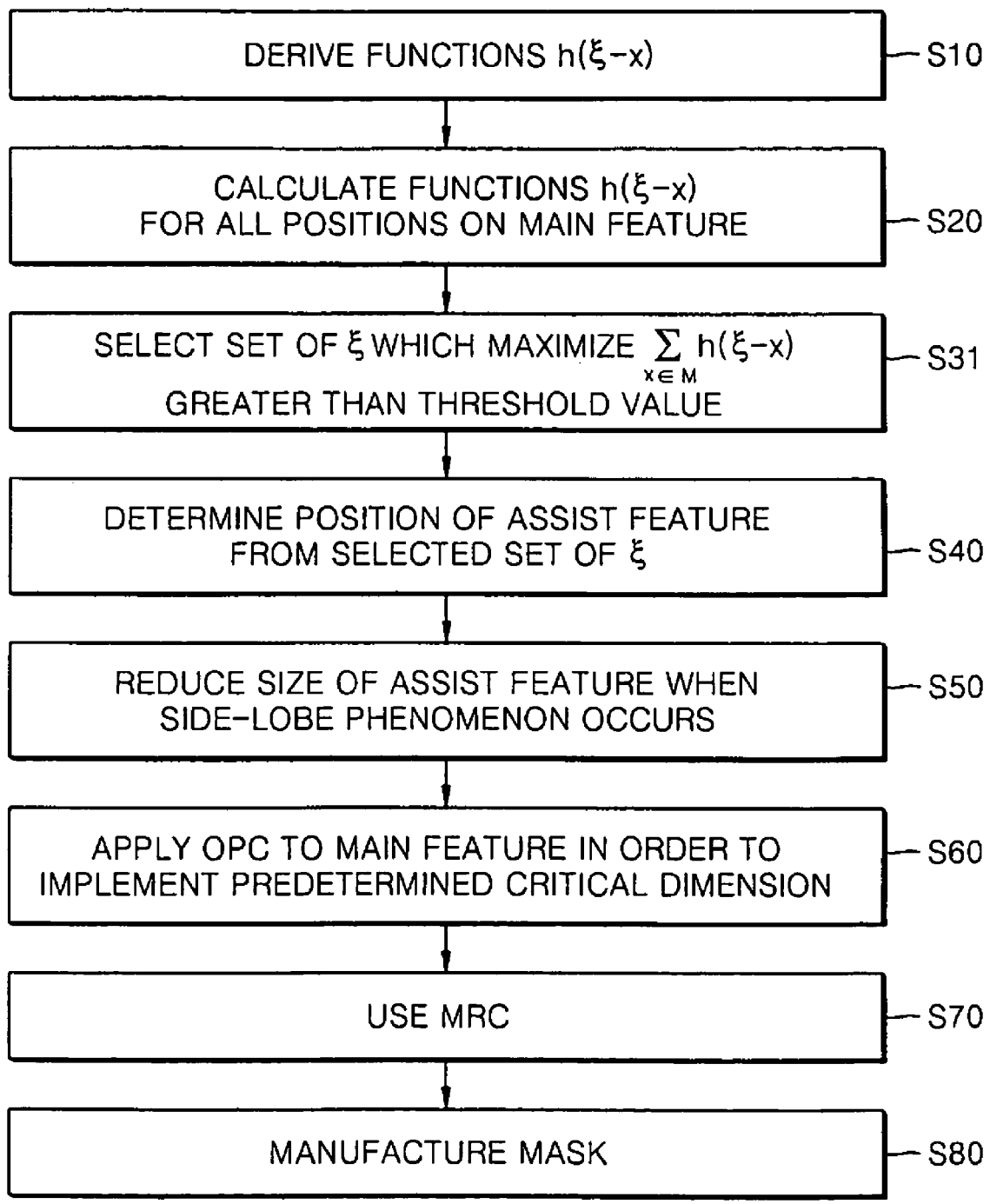

Referring to FIG. 2, in order to select the set of ξ which maximize Equation 8, Equation 9 has to be satisfied.

$$\sum_{x \in M} h(\xi - x) \geq T \geq 0 \tag{9}$$

Figure 3:
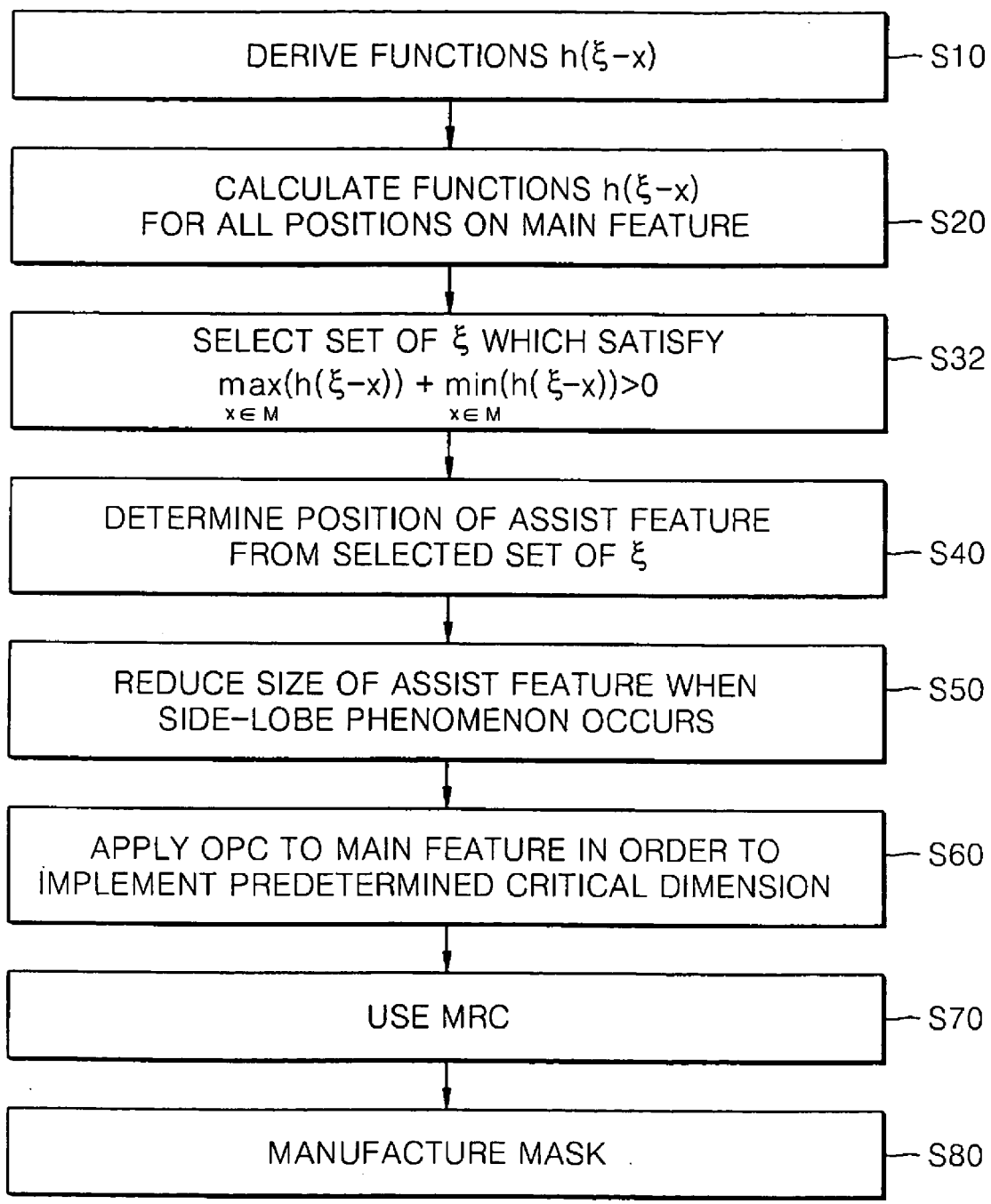

Referring to FIGS. 2 and 3, in operation S20, functions h(ξ-x) of an assist feature for all positions on main features are calculated by referring to a look-up table.

Figure 6:
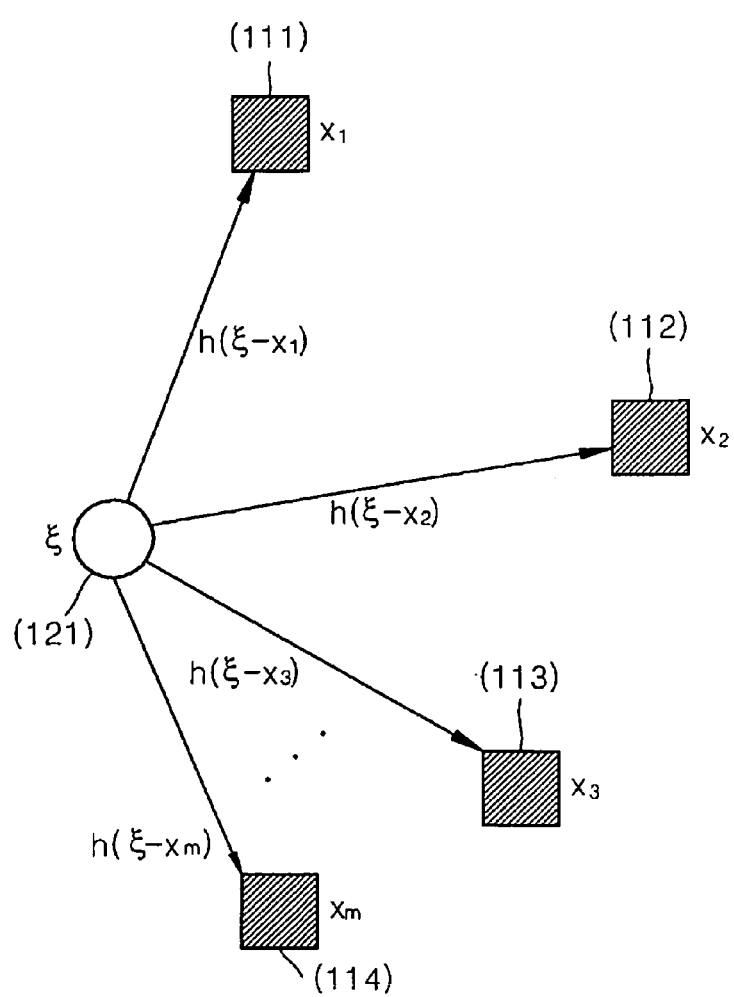
FIG. 6 is a flow diagram that is referenced to describe methods of calculating functions h of an assist feature for all positions on main features according to some embodiments of the present invention.

FIG. 6 is a flow diagram that is referenced to describe a method/apparatus for calculating functions h as an assist feature for all positions on main features according to some embodiments of the present invention. Referring to FIG. 6, an assist feature 121 is fixed and then h(ξ-x) is calculated for each of all positions on main features. That is, a function h(ξ-x₁) for a position X₁ of a first main feature 111 can be obtained directly from a table of functions h calculated in advance. A function h(ξ-x2) for a position X₂ of a second main feature 112 can be obtained directly from the table of functions h calculated in advance. A function h(ξ-x3) for a position X₃ of a third main feature 113 can be obtained directly from the table of functions h calculated in advance. A function h(ξ-Xm) for a position Xm of an mth main feature 114 can be obtained directly from the table of functions h calculated in advance.

Thus, according to the method of FIG. 2, in operation S31, a set of ξ which make $$\sum_{x \in M} h(\xi - x)$$

greater than a first threshold value T₁ are selected. In operation S40, the position of the assist feature is determined from the set of ξ. Here, M indicates the entire domain of the mask. The first threshold value T₁ may be set to zero so that the functions h can contribute to the image intensity I(x) as a positive value. That is, when a value obtained by fixing the position of the assist feature 121, immediately calculating the function h for each of all the positions of the main features on the mask, and summing up the functions h is greater than 0 as shown in Equation 9, an assist feature may be generated at the position of the assist feature 121. However, when a value obtained by fixing the position of the assist feature 121, immediately calculating the function h for each of all the positions of the main features on the mask, and summing up the functions h is less than 0, an assist feature may not be generated at the position of the assist feature 121. Although the method of FIG. 2 can be advantageous in determining an optimal position of an assist feature, an undesirable length of time may be needed to sum up functions h for all areas of a mask.

Accordingly, the position of an assist feature may be determined from a set of ξ which satisfy a condition that a linear combination of the maximum and the minimum of the function h(ξ-x) is equal to or greater than a second threshold value T₂, without having to sum up all functions h. Referring to FIG. 3, in operation S32, a set of ξ which satisfy a condition that Equation 10 is equal to or greater than the second threshold value T₂ are selected. In operation S40, the position of the assist feature is determined from the selected set of ξ.

$$A \cdot \max_{x \in M} h(\xi - x) + B \cdot \min_{x \in M} h(\xi - x) \tag{10}$$

where M indicates the entire domain of the mask.

The second threshold value T₂ may be set to zero so that the function h can contribute to the image intensity I(x) as a positive value. Also, A and B may be constants and may preferably be 0.5. That is, the integral area of the function h is simply calculated by averaging the maximum and the minimum. Unlike the method of FIG. 2 using Equation 9, since the method of FIG. 3 using Equation 10 does not have to sum up all functions h, a time taken to determine the position of the assist feature can be reduced.

However, the method of FIG. 3 require time to calculate the minimum and the maximum of h(ξ-x) with respect to x and ξ. Methods of more quickly arranging mask patterns are shown in FIG. 4.

Figures 7, 8:
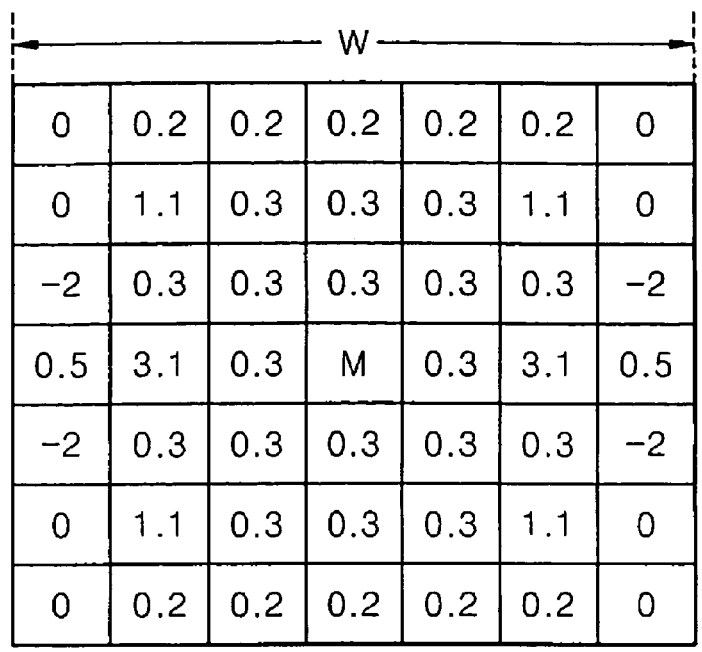
FIG. 7 illustrates a distribution of functions h(ξ–x) for neighboring regions of a main feature having a predetermined size according to some embodiments of the present invention.
FIG. 8 illustrates a distribution of representative values replacing the functions h(ξ–x) for the neighboring regions of the main feature having the predetermined size of FIG. 7 according to some embodiments of the present invention.
Figure 11:
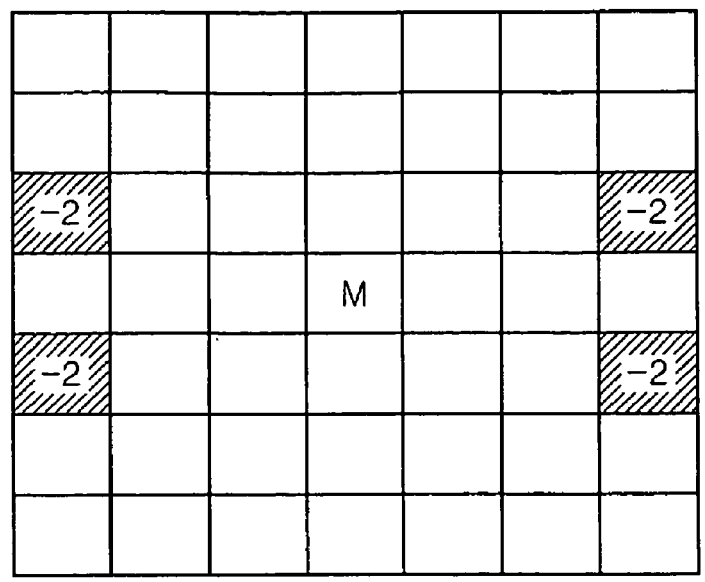
Figure 12:
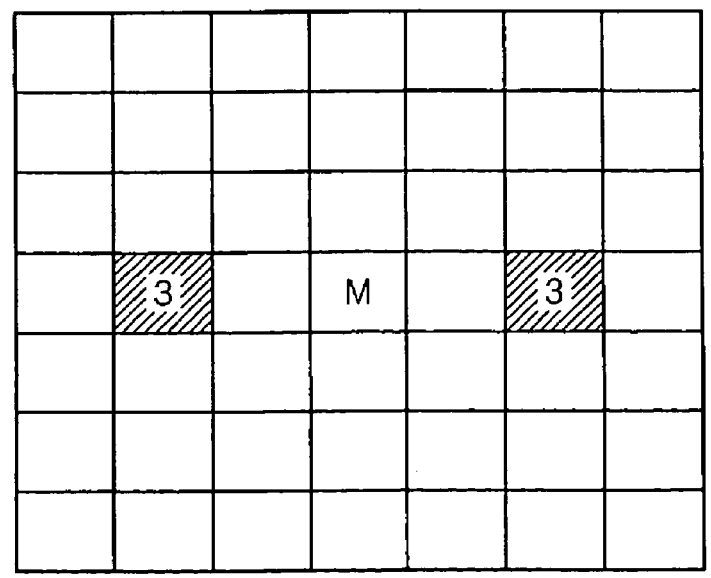

FIG. 7 is a view illustrating the distribution of functions h(ξ-x) for neighboring regions of a main feature M having a predetermined size. Referring to FIG. 7. For example, the functions h(ξ-x) have values of -2, 0, 0.2, 0.3, 1.1, and 3.1. The distribution of the functions h(ξ-x) has a finite width W about the main feature M. The width W is approximately 1 to 2 μm and corresponds to 1000 to 2000 pixels. The methods of FIG. 4 discretizes the neighboring regions of the main feature M into finite regions and replaces the distribution of the functions h(ξ-x) with representative values ħ(x,ξ) of the discretized regions.

Figure 4:
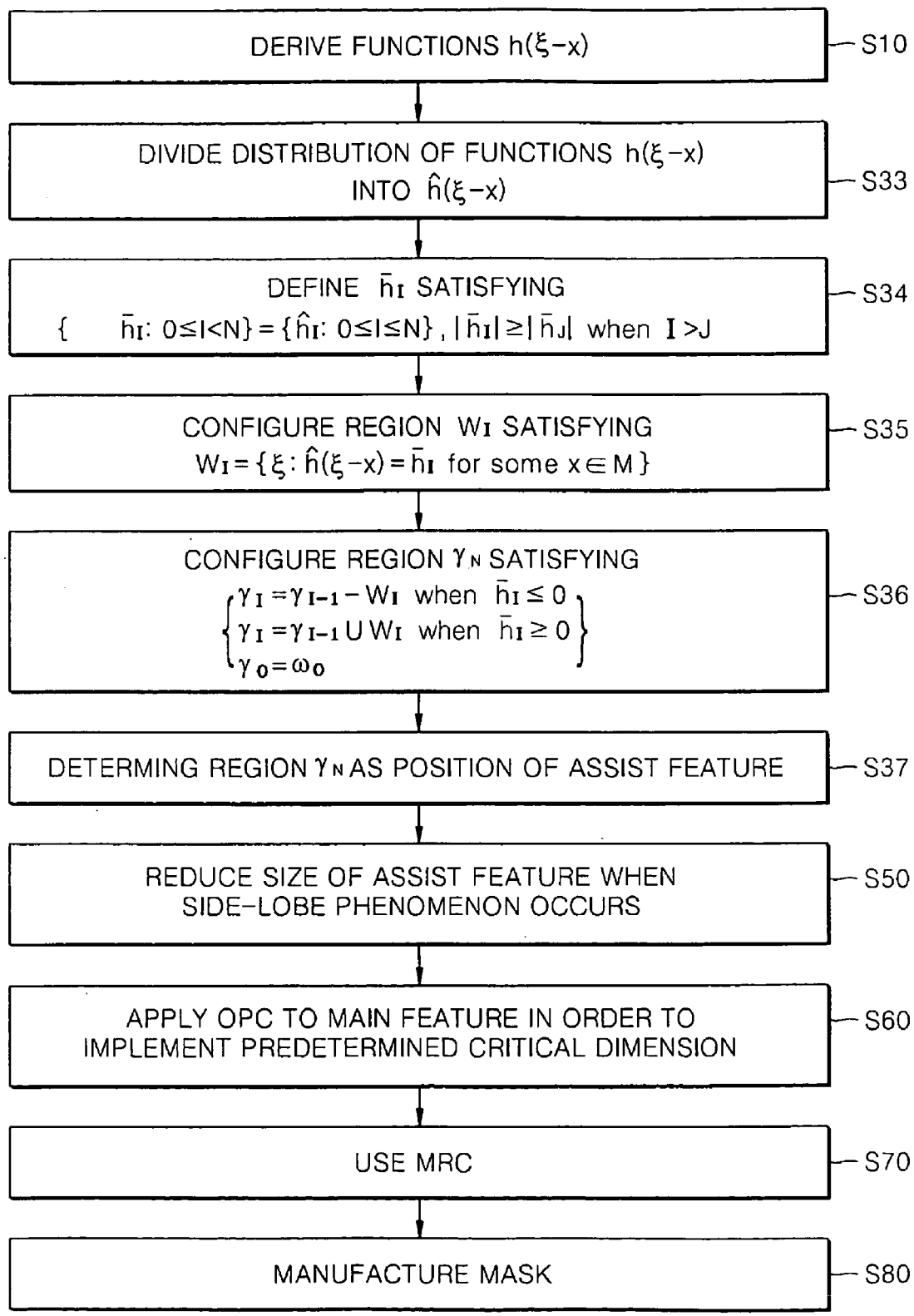

FIG. 8 illustrates the distribution of the representative values ħ(x,ξ) replacing the functions h(ξ-x) for the neighboring regions of the main feature M of FIG. 7 (e.g., operation S33 of FIG. 4). Referring to FIG. 8, for example, when decimals are omitted and remaining numbers are representative values ħ(x,ξ) for the neighboring regions of the main feature M, the representative values ħ(x,ξ) are -2, 0, 1, and 3. That is, ħ₀, ħ₁, ħ₂, ħ₃ become -2, 0, 1, and 3, respectively. The distribution of h̄(x,ξ) may be derived from the distribution of ħ(x,ξ). h̄(x,ξ) is defined (e.g., operation S34 of FIG. 4) by {h̄ᵢ:0≤I≤N}={ħᵢ:0≤I≤N} when I≥J, |h̄ᵢ|≥|h̄ⱼ| (11)

According to h̄(x,ξ) defined by Equation 11, h̄₀, h̄₁, h̄₂, h̄₃ become 0, 1, -2, and 3, respectively.

A region ωᵢ is defined (e.g., operation S35 of FIG. 4) by

ωᵢ={ξ:h̄(ξ-x)=h̄ᵢ for some x∈M} (12).

FIGS. 9 through 12 illustrate regions where h̄₀, h̄₁, h̄₂, h̄₃ respectively are 0, 1, -2, and 3 among the neighboring regions of the main feature M having the predetermined size of FIG. 7.

Figures 9, 10:
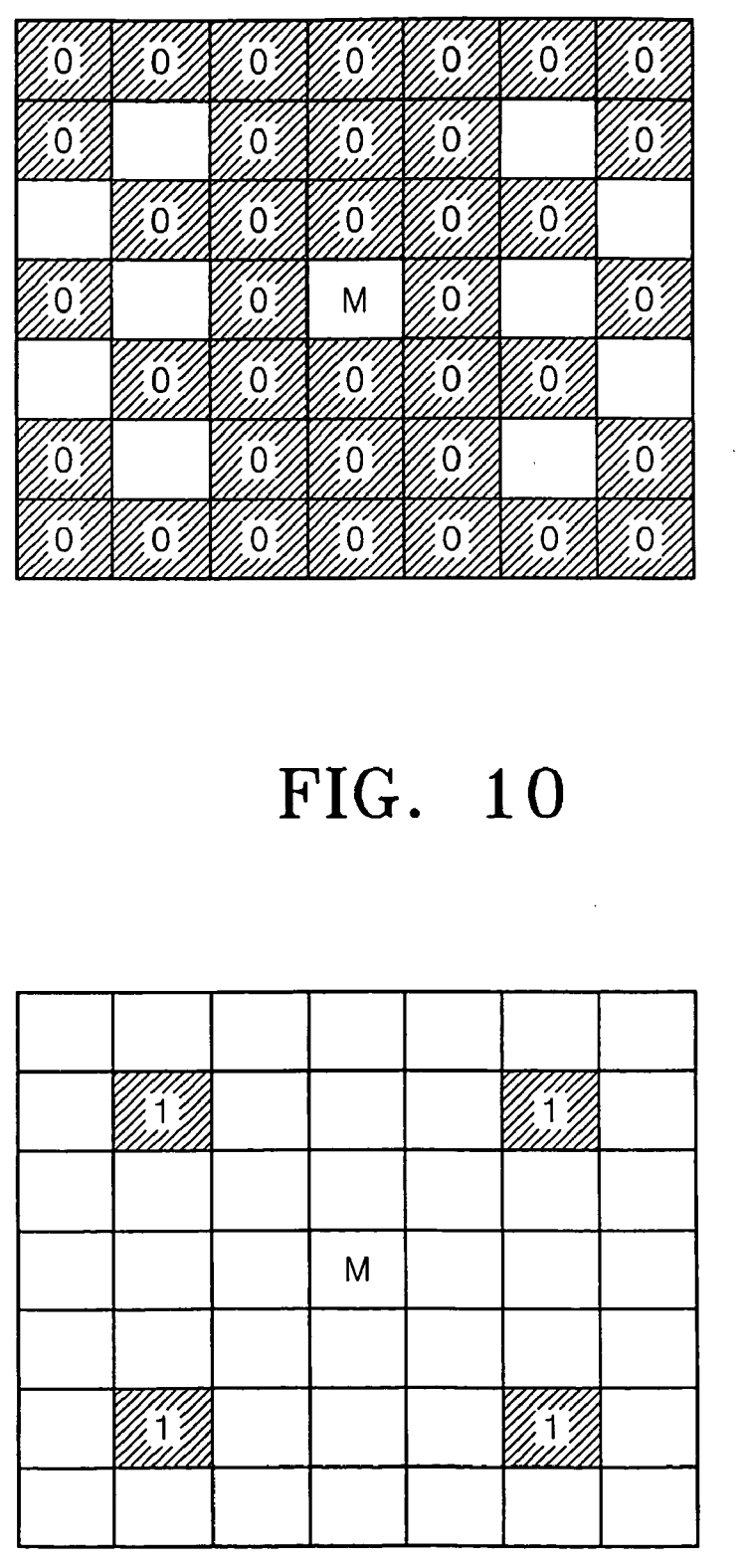

Referring to FIG. 9, a region where h̄₀ is 0 is formed about the main feature M having the predetermined size. The distribution of values of h̄₀ has a finite width about the main feature M. The width is approximately 1 to 2 μm and corresponds to 1000 to 2000 pixels. Since a region ω₀ is a region having h̄₀ on all main features on a mask domain, the region having h̄₀ shown in FIG. 9 is shifted and repeated for all the main features on the mask domain. That is, regions ω₀ are simply formed by shifting and repeating the region having h̄₀ of FIG. 9 with respect to all the main features on the mask domain.

In the same manner, regions ω₁ are formed by repeating a region having h̄₁ of FIG. 10 with respect to all the main features on the mask domain. Also, regions ω₂ are formed by repeating a region having h̄₂ of FIG. 11 with respect to all the main features on the mask domain. Regions $\omega_3$ are formed by repeating a region having $\bar{h}_3$ of FIG. 12 with respect to all the main features on the mask domain.

An assist feature may be placed in a region γN defined by Equation 13 (e.g., operation S36 of FIG. 4) by using the region $\omega_I$.

$$\gamma_I = \gamma_{I-1} - \omega_I \text{ when } \bar{h}_I \leq 0 \quad (13)$$
$$= \gamma_{I-1} - U\omega_I \text{ when } \bar{h}_I > 0$$
$$\gamma_0 = \omega_0.$$

That is, the region γI is defined (e.g., operation S37 of FIG. 4) as follows.

When $\bar{h}_I$ is less than 0, the region γI is obtained by excluding an overlapped region between a region γI−1 and a region $\omega_I$ from the region γI−1. When $\bar{h}_I$ is greater than 0, the region γI is obtained by adding the region ωI to the region γI−1. This will now be explained by using $\hat{h}(x,\xi)$ of FIG. 8.

FIGS. 13 through 16 illustrate methods of determining a region γI according to some embodiments of the present invention.

Figure 13:
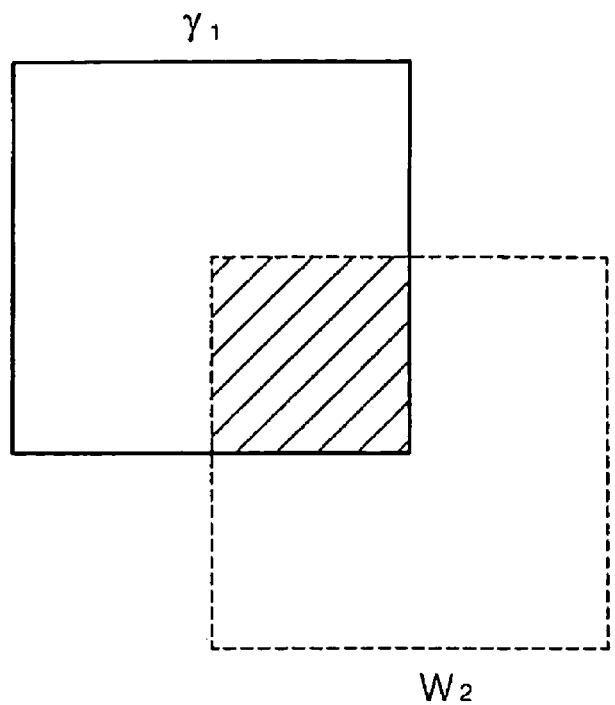
FIGS. 13 through 16 illustrate apparatus/methods for determining a region γI according to some embodiments of the present invention.
Figure 14:
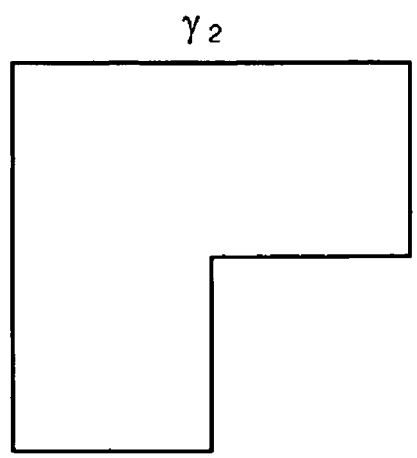

First, referring to FIGS. 13 and 14, since $\bar{h}_2$ is less than 0 as described above, a region γ2 is obtained by excluding an overlapped region between the regions γ1 and $\omega_2$ from the region γ1.

Figure 15:
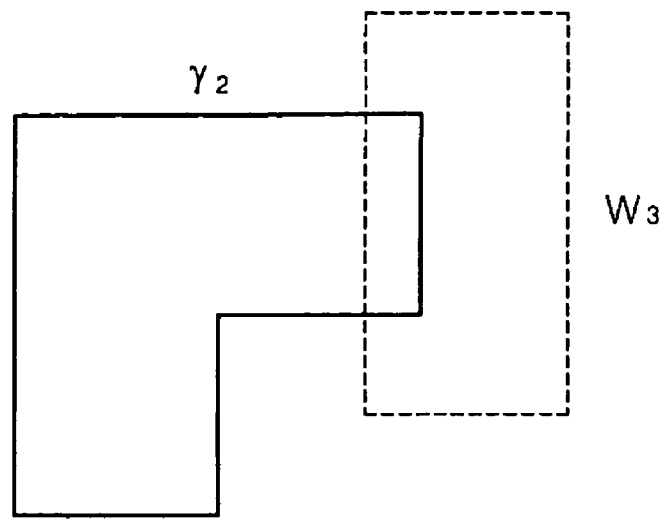
Figure 16:
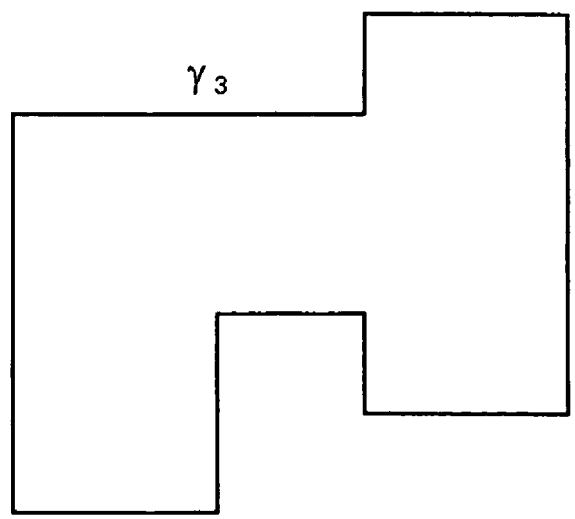

Referring to FIGS. 15 and 16, since $\bar{h}_3$ is greater than 0, a region $\gamma_3$ is obtained by adding a region $\omega_3$ to the region γ2.

It can be found that a region $\gamma_N$ obtained in this manner is equal to a region $\hat{\Pi}$ of Equation 14.

$$\hat{\Pi} = \left\{\xi: \max_{x \in M} \hat{h}(\xi - x) + \min_{x \in M} \hat{h}(\xi - x) > 0\right\}. \quad (14)$$

The methods of placing the assist feature in the region γN of FIG. 4 may advantageously have a high calculation efficiency. That is, the region $\hat{\Pi}$ is determined by calculating each pixel whereas the region γN is determined by collecting pixels according to $\hat{h}(x,\xi)$ to generate polygons and calculating the polygons, thereby improving calculation efficiency. In general, since one polygon in a semiconductor pattern corresponds to more than tens to hundreds of pixels, the methods of calculating polygons can therefore be superior in calculation efficiency to a method of calculating pixels.

Subsequent operations will now be explained with reference to FIGS. 1 through 4.

After the operation S40 (e.g., operation S50 of FIG. 4) in which the position of the assist feature is determined, a sidelobe phenomenon where the assist feature is printed on a semiconductor wafer may occur. That is, although the assist feature is a pattern formed on the mask in order to accurately reproduce the main feature on the semiconductor wafer, the assist feature may be printed on the semiconductor wafer, which is dependent on the size of the assist feature. Accordingly, in operation S50, the size of the assist feature is reduced in order to prevent the assist feature from being printed on the semiconductor wafer. In operation S60, optical proximity correction (OPC) is applied to the main feature in order to implement a predetermined critical dimension on the semiconductor wafer. In operation S70, a mask rule check (MRC) is used in order to improve mask performance, that is, in order to accurately reproduce patterns implemented on the semiconductor wafer. The above operations S50 through S70 are performed after the operation S40 in which the position of the assist feature is determined. However, in modified embodiments of the present invention, the operations S50, S60, and S70 illustrated in FIGS. 1 through 3 may be performed in different orders and some of the operations S50 through S70 may be omitted. In operation S80, a design of mask patterns arranged after the operations S10 through S70 are performed is implemented as patterns on the mask in a subsequent manufacturing process. The method of arranging the mask patterns is a systematic and general method of placing an assist feature, such that stable results can be obtained irrespective of the shape and arrangement of a main feature and the position of the assist feature can be automatically determined.

The operations and methods described herein can be implemented by computer-readable program code. This program code may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

This program code may also be stored in a computer-readable storage medium that can direct a computer (also referred to as a programmable data processing apparatus) to function in a particular manner, such that the instructions stored in the computer-readable storage medium produce an article of manufacture including instructions which implement the function/act specified in the block diagrams and/or flowchart block or blocks.

A computer-readable storage medium having stored thereon program code for executing the methods and operations of determining an optimal position of an assist feature of a mask according to some embodiments of the present invention will now be explained.

As described above, the program code stored on the storage medium can be executed by a general purpose computer, special purpose computer, and/or other programmable data processing computer apparatus. In some embodiments, the program code and possibly the associated data records can be stored within the memory of a general-purpose computer, stored at other locations within a computer system, and/or transported on a transportable computer readable storage medium for loading into an appropriate general-purpose computer system. Hence, the embodiments discussed above involve one or more computer program products in the form of one or more modules of program code carried by at least one computer-readable storage medium having computer-readable program code embodied in the medium. Execution of such program code by a processor of the computer system enables the system to implement the catalogue and/or software downloading functions, in essentially the manner performed in the embodiments discussed and illustrated herein.

As used herein, terms such as computer or machine "readable storage medium" refer to any medium that participates in providing instructions to a processor for execution. Such a medium may take many forms, including but not limited to, non-volatile media, and volatile media. Non-volatile media include, for example, optical or magnetic disks, such as any of the storage devices in any computer(s) operating as one of the server platform, discussed above. Volatile media include dynamic semiconductor memory, such as main memory of such a computer platform. Common forms of computer-readable storage media therefore include, for example: a floppy disk, a flexible disk, a hard disk, a magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, or any other medium from which a computer can read programming code and/or data. Many of these forms of computer readable media may be involved in carrying one or more sequences of one or more instructions to a processor for execution.

Accordingly, at least some of the operations and methods described herein for some embodiments, and in other embodiments all of the operations and methods described herein, can be carried-out automatically by a computer executing program code that causes the computer to controls an apparatus that positions the mask and/or the device being imaged in response to an electronically sensed contribution of the assist feature to image intensity as described herein. As used herein, the term "automatically" means that the associated function is carried out without human intervention, such as by a computer operating according to predefined program code.

As described above, the methods of arranging the mask patterns and the apparatus using methods according to various embodiments of the present invention may more rapidly determine an optimal position of the assist feature for the shape and arrangement of the main feature.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A computer-implemented method of arranging mask patterns, the method comprising:
    obtaining a distribution of functions h(ξ-x) representing the contribution of an assist feature to image intensity on a main feature, wherein x is the position of the main feature and ξ is the position of the assist feature, wherein (ξ-x) represents displacement between the main feature and the assist feature, and wherein the distribution of the functions h(ξ-x) satisfy $$\frac{I(x) - I_0(x)}{2\sqrt{I_0(x)}} = h(\xi - x)m(\xi)\Delta\xi,$$

where I(x) is an image intensity on the main feature when the assist feature is present, $I_0(x)$ is an image intensity on the main feature when the assist feature is not present, and m(ξ) is a mask transmittance;
    discretizing neighboring regions of the main feature into finite regions and discretizing the distribution of the functions h(ξ-x) into the finite regions to generate a distribution of discretized values $\hat{h}(x,\xi)$ consisting of $\hat{h}_0$, $\hat{h}_1, \hat{h}_2, \ldots, \hat{h}_N$;
    generating from the distribution of discretized values $\hat{h}(x, \xi)$ a distribution of representative values $\bar{h}(x,\xi)$ consisting of $\bar{h}_0, \bar{h}_1, \bar{h}_2, \ldots, \bar{h}_N$ and that satisfy $$\{\bar{h}_I : 0 \le I \le N\} = \{\hat{h}_I : 0 \le I \le N\}$$

when $I \ge J$, $|\bar{h}_I| \ge |\bar{h}_J|$;

determining a position of the assist feature by using polygonal regions having the same $\bar{h}(x,\xi)$; and generating, by a computer, a mask pattern using the determined position of the assist feature.

2. The method of claim 1, wherein the determining of the position of the assist feature comprises:
    determining, by using the distribution of $\bar{h}(x,\xi)$, a region $\omega_I$ (I=0, 1, ..., N) satisfying $\omega_I = \{\xi : \bar{h}(\xi-x) = \bar{h}_I$ for some $x \in M\}$;
    determining, by using the region $\omega_I$ (I=0, 1, ..., N), a region γN satisfying $$\gamma_I = \gamma_{I-1} - \omega_I \text{ when } \bar{h}_I \le 0$$
$$= \gamma_{I-1} - U\omega_I \text{ when } \bar{h}_I > 0$$
$$\gamma_0 = \omega_0;$$
and determining the region γN as the position of the assist feature.

3. The method of claim 1, wherein the determining of the position of the assist feature comprises:
    determining, with the use of $\bar{h}(x,\xi)$, a region $\omega_I$ (I=0, 1, ..., N) that satisfies $\omega_I = \{\xi : \bar{h}(\xi-x) = \bar{h}_I$ for some $x \in M\}$;
    obtaining a region γN by excluding a region $\omega_J$ where $\bar{h}_J$ is less than 0 from a region including all the region $\omega_I$ (I=0, 1, ..., N); and
    determining the region γN as the position of the assist feature.

4. The method of claim 1, further comprising reducing the size of the assist feature in response to when a side-lobe phenomenon where the assist feature is printed on a semiconductor wafer is detected after the determining of the position of the assist feature.

5. The method of claim 1, further comprising applying an optical proximity correction process to the main feature to obtain a critical dimension after the determining of the position of the assist feature.

6. The method of claim 1, further comprising applying a mask rule check process to improve mask performance after the determining of the position of the assist feature.

7. The method of claim 1, wherein the discretizing of the neighboring regions of the main feature into the finite regions comprises discretizing the neighboring regions into finite square shaped regions.

8. The method of claim 1, wherein the neighboring regions of the main feature have a width W of 1000 to 2000 pixels.

9. A computer program product that is configured, when executed by a computer, to arrange mask patterns, the computer program product comprising a non-transitory computer-readable storage medium having computer-readable program code embodied in the medium, the computer-readable program code comprising:
    computer-readable program code that is configured to obtain a distribution of functions h(ξ-x) representing the contribution of an assist feature to image intensity on a main feature, wherein x is the position of the main feature and ξ, is the position of the assist feature, wherein (ξ-x) represents displacement between the main feature and the assist feature, and wherein the distribution of the functions h(ξ-x) satisfy $$\frac{I(x) - I_0(x)}{2\sqrt{I_0(x)}} = h(\xi - x)m(\xi)\Delta\xi,$$

where I(x) is an image intensity on the main feature when the assist feature is present, $I_0(x)$ is an image intensity on the main feature when the assist feature is not present, and $m(\xi)$ is a mask transmittance;

computer-readable program code that is configured to discretize neighboring regions of the main feature into finite regions and discretize the distribution of the functions $h(\xi-x)$ into the finite regions to generate a distribution of discretized values $\hat{h}(x,\xi)$ consisting of $\hat{h}_0, \hat{h}_1, \hat{h}_2, \ldots, \hat{h}_N$;

computer-readable program code that is configured to generate from the distribution of discretized values $\hat{h}(x,\xi)$ a distribution of representative values $\bar{h}(x,\xi)$ consisting of $\bar{h}_0, \bar{h}_1, \bar{h}_2, \ldots, \bar{h}_N$ and that satisfy $$\{\bar{h}_I : 0 \leq I \leq N\} = \{\hat{h}_I : 0 \leq I \leq N\}$$
when $I \geq J$, $|\bar{h}_I| \geq |\bar{h}_J|$;

computer-readable program code that is configured to determine a position of the assist feature by using polygonal regions having the same $\bar{h}(x,\xi)$; and computer-readable program code that, when executed by the computer, controls manufacturing of a mask pattern using the determined position of the assist feature.

10. The computer program product of claim 9, wherein the determining of the position of the assist feature comprises:
determining, by using the distribution of $\bar{h}(x,\xi)$, a region $\omega_I$ (I=0,1,...,N) satisfying $\omega_I = \{\xi : \hat{h}(\xi-x) = \bar{h}_I$ for some $x \in M\}$;

determining, by using the region $\omega_I$ (I=0, 1, ..., N), a region $\gamma N$ satisfying $$\gamma_I = \gamma_{I-1} - \omega_I \text{ when } \bar{h}_I \leq 0$$
$$= \gamma_{I-1} - U\omega_I \text{ when } \bar{h}_I > 0$$
$$\gamma_0 = \omega_0;$$
and determining the region $\gamma N$ as the position of the assist feature.

11. The computer program product of claim 9, wherein the determining of the position of the assist feature comprises:
determining, with the use of $\bar{h}(x,\xi)$, a region $\omega_I$ (I=0,1,...,N) that satisfies $\omega_I = \{\xi : \hat{h}(\xi-x) = \bar{h}_I$ for some $x \in M\}$;

obtaining a region $\gamma N$ by excluding a region $\omega_j$ where $\bar{h}_j$ is less than 0 from a region including all the region $\omega_I$ (I=0,1,...,N); and determining the region $\gamma N$ as the position of the assist feature.

12. The computer program product of claim 9, wherein the computer-readable program code that is configured to discretize the neighboring regions of the main feature into finite regions is further configured to discretize the neighboring regions into finite square shaped regions.

13. The computer program product of claim 9, wherein the computer-readable program code that is configured to discretize the neighboring regions with a width W of 1000 to 2000 pixels.

* * * * *